(12) United States Patent
Kovats et al.

(10) Patent No.: US 6,177,722 B1
(45) Date of Patent: *Jan. 23, 2001

(54) LEADLESS ARRAY PACKAGE

(75) Inventors: Julius A. Kovats, Manitou Springs, CO (US); Paul I. Suciu, Saratoga, CA (US)

(73) Assignee: Atmel Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/063,817

(22) Filed: Apr. 21, 1998

(51) Int. Cl.[7] ................................................ H01L 23/48
(52) U.S. Cl. ......................... 257/690; 257/784; 257/787
(58) Field of Search ................... 257/701, 784, 257/787, 690; 361/777, 772

(56) References Cited

U.S. PATENT DOCUMENTS

| | | | |
|---|---|---|---|
| 4,423,468 | * 12/1983 | Gatto et al. | 361/404 |
| 5,047,711 | 9/1991 | Smith et al. | 324/158 R |
| 5,059,557 | 10/1991 | Cragon et al. | 437/208 |
| 5,126,286 | 6/1992 | Chance | 437/203 |
| 5,222,014 | * 6/1993 | Lin | 361/414 |
| 5,235,496 | * 8/1993 | Chomette et al. | 361/764 |
| 5,239,191 | 8/1993 | Sakumoto et al. | 257/203 |
| 5,239,198 | * 8/1993 | Lin et al. | 257/693 |
| 5,304,843 | * 4/1994 | Takubo et al. | 257/670 |
| 5,356,838 | 10/1994 | Kim | 437/226 |
| 5,388,029 | * 2/1995 | Moriyama | 361/760 |
| 5,731,222 | 3/1998 | Malloy et al. | 437/182 |
| 5,731,630 | * 3/1998 | Suyama et al. | 257/701 |
| 5,783,464 | 7/1998 | Burns | 438/112 |
| 5,832,600 | 11/1998 | Hashimoto | 29/841 |
| 5,880,011 | 3/1999 | Zablotny et al. | 438/462 |
| 5,888,884 | 3/1999 | Wojnarowski | 438/462 |
| 5,904,496 | 5/1999 | Richards et al. | 438/118 |

OTHER PUBLICATIONS

Amkor Chip Arrary brochure, "Chip Array Data Sheet", Jan., 1997.

* cited by examiner

*Primary Examiner*—Carl Whitehead, Jr.
*Assistant Examiner*—Roy Potter
(74) *Attorney, Agent, or Firm*—Thomas Schneck; John P. McGuire, Jr.

(57) ABSTRACT

A leadless array integrated circuit package that uses a standard surface mount footprint, but allows use of larger silicon die. The leadless array package mounts to the end user's printed circuit board by solder flow contacts on the perimeter of the chip package that melds with solder paste applied to the printed circuit board and heated in a furnace during package fabrication. The IC chip is laid on a substrate made of a printed circuit board material to reduce thermal mismatches between the leadless array package and the end user's printed circuit board.

11 Claims, 2 Drawing Sheets

LEADLESS ARRAY PACKAGE

FIELD OF THE INVENTION

This invention relates to the field of integrated circuit packages.

BACKGROUND ART

In integrated circuit fabrication, a continuing challenge is to manufacture electrical assemblies with greater densities and smaller package size. It is extremely important to utilize available space on a printed circuit board in the most efficient manner possible. The trend in integrated circuit packaging is away from traditional dual-in-line and through-hole packaging and towards surface-mount packages, such as small outline packages, ball grid arrays and chip carrier packages. Surface mounting is a process in which a packaged IC is physically mounted onto the surface of a printed circuit board (PCB), rather than inserting leads into plated holes through the PCB. Package specifications, such as outlines, pin configuration, and dimensions are often defined by industry associations, such as JEDEC.

Most surface-mount devices use leads to mount the chip packages onto the surface of a PCB. Small outline IC packages (SOICs) and quad flat packs (QFPs) frequently use "gull wing" leads, which spread away from the device. The main advantage of the gull wing is that the solder joint can be easily inspected. The disadvantage is that the exposed leads tend to bend and break in handling prior to reflow on the system board. Another disadvantage is that the leads take additional space on the PCB since the leads are spread out.

Another type of leads used are "J leads", in which the leads are tucked under the device and shaped like the letter "J". "J-leads" are commonly used on plastic-leaded chip carriers (PLCCs). The advantages of the "J-leads" are that they occupy less board space and that the leads are protected underneath the device. However, this makes it more difficult to test, inspect or repair the device and does not allow for low profile mounting.

Leadless integrated circuit packaging is known in the prior art. U.S. Pat. No. 5,535,101 to Miles et al. discloses a leadless integrated circuit package that uses a ball grid array for mounting to the printed circuit board. A ball grid array mounts to the printed circuit board using solder balls located on the underside of the package. There are some advantages to this arrangement such as the package being smaller in size due to the lack of leads jutting out from the edge of the package. However, there are some disadvantages to the ball grid array (BGA) system. Firstly, the solder joints are hidden beneath the package, making visual inspection and in-situ probe testing virtually impossible. Also, the cost of a BGA system is higher because BGAs have a circuit board that holds the chip and fans out the leads. Although BGAs take less space from an area standpoint, routing traces to them use more PCB layers. This can serve to increase the cost of the overall system.

SUMMARY OF THE INVENTION

The present invention is an integrated circuit package that mounts directly to a PCB, without pins, but has accessible contacts for testing and inspection. The leadless package of the present invention uses contacts on the edge of the package that extend over the solder reflow pads on the end user's board to mount to the printed circuit board. The leadless package has a footprint similar to a standard surface mount package. Because of the method used for mounting, larger silicon die can be used than in the standard packaging. Because there are no leads, the space which would otherwise be used by a lead frame is now useable for containing the silicon device chip.

The leadless array package has a substrate made of the same material as most end user's printed circuit boards so thermal mismatch, which is a common problem with surface mount components, is significantly reduced. Additionally, because the electrical contacts are on the outside perimeter of the leadless array package, inspection and testing of the package can be done much more easily than for packages that have ball-grid array type mounting systems.

BEST MODE FOR CARRYING OUT THE INVENTION

Figure 1:
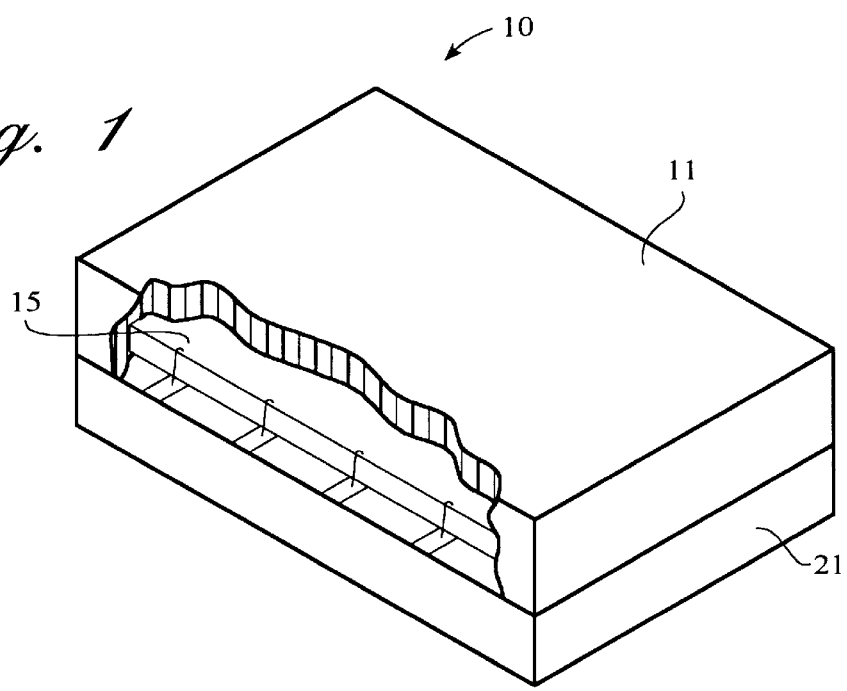
FIG. 1 is a perspective view of a leadles array package.

With reference to FIG. 1, the leadless array package 10 is assembled in a sort of "sandwich" arrangement. A base layer 21, made of a substrate material, comprises the bottom of the leadless array package. An integrated circuit chip 15 is bonded on top of the base layer 21, and an encapsulant material 11 covers the top of the integrated circuit chip 15 and the base layer 21. The complete leadless array package 10 is then ready to be mounted on the end user's printed circuit board.

Figure 2:
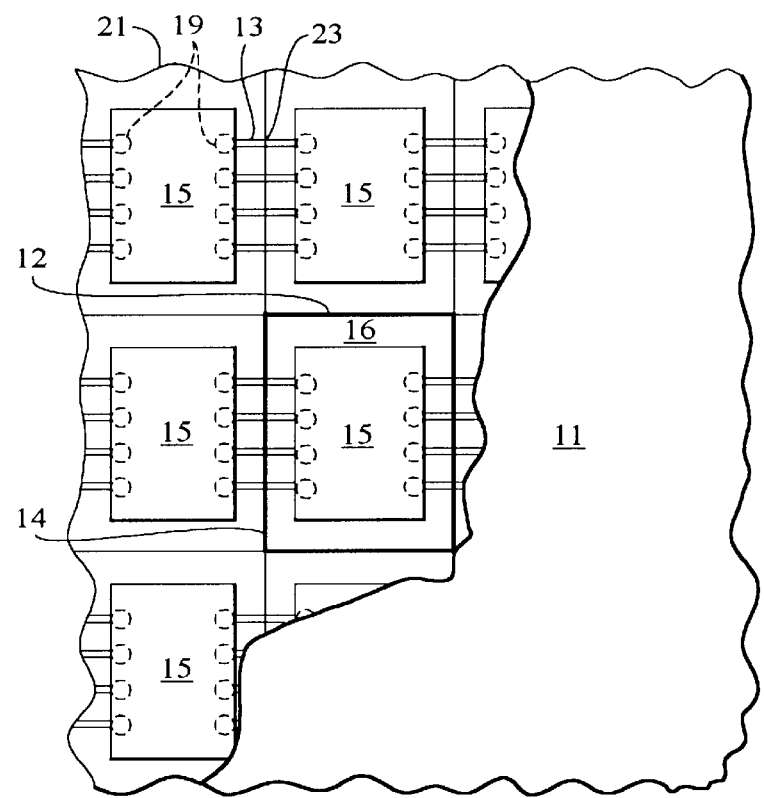
FIG. 2 is a top view of an arrangement of leadless array packages during a manufacturing stage illustrating a first embodiment of the invention.

With reference to FIG. 2, the base layer 21 is made of a substrate material such as epoxy-glass or another suitable material that is commonly used for manufacturing printed circuit boards. The reason for using this type of substrate material for the base layer 21 is that by using the same or similar material for the substrate as that material of which the end user's printed circuit board is made, the possibility of thermal mismatch is significantly reduced. By reducing the possibility of thermal mismatch, mechanical stresses due to differing thermal expansion coefficients are reduced, which consequently reduces the possibility of solder and wire bond failures in the chip package. The base layer 21 will eventually be singulated, at the end of the manufacturing process, into individual separate base layer areas 16, one base layer area for each chip. The length 14 and width 12 of each individual base layer area 16 is equivalent to the standard dimensions of a small outline integrated circuit (SOIC) chip package footprint. The substrate material for the base layer 21 is generally thin, having a nominal thickness of approximately 0.38–0.64 millimeters. In one embodiment of this invention, the base layer is made of an 35 mm epoxy-glass tape that is packaged on a roll, similar to 35 mm movie film. The use of the epoxy-glass tape in this form makes the manufacturing process compatible with many automated handling, testing and placement systems and is also convenient for parallel testing.

The present invention may also be able to be used with other types of IC footprints, such as TSOP, but it must be used with an integrated circuit chip having a small lead count (32 pins or smaller). This is because the leads of the IC chip must be on the perimeter of the IC chip in order to be accessible after mounting. The number of leads are limited by the size of the perimeter of the IC chip. Even at minimum width, spacing must exist between leads to prevent shorting. To gain additional space, all four sides of the chip may be used for leads, provided that the user can provide PCB routing for the leads. If the IC chip is too large, thermal mismatches between the silicon die of the chip and the base layer substrate are too great and the chip package would be very likely to crack. The proper size chip must be determined for each base layer area.

Continuing with reference to FIG. 2, on top of the base layer 21 are arranged a series of metal bonding pads 19 on which the integrated circuit chips 15 can be mounted. The metal bonding pads 19 are arranged to correspond to the size of the integrated circuit chip 15. The metal pads 19 can be arranged to accommodate IC chips having contacts on two sides or four sides. In FIG. 2, the contacts are shown to be on two sides of the IC chip. The integrated circuit chip 15 is generally smaller than the individual base layer area 16, but it can be the same size as the base layer area 16 (and hence, the same size as a standard SOIC package). In FIG. 2, the integrated circuit chip 15 is smaller than the base layer area 16. One integrated circuit chip 15 is to be mounted in each base layer area 16. Over the entire base layer 21, a large array of integrated circuit chips (such as 100×150 chips) can be laid out. It is advantageous to manufacture a large number of chip packages at one time, as it saves time and cost to be able to manufacture and test a large number of chip packages at once. When the IC chips 15 are laid out on the base layer 21, die are attached to the top side of the board and are wire bonded 13 between the metal chip pads 19 and the board contacts 23, which are on the edge of each individual base layer area 16. When the industry standard size chip is used, as in FIG. 2, generally there is about 1.4 mm of space between the edge of the chip 15 and the edge of the base layer 21 to allow for standard wire bond and die attachment.

Figure 3:
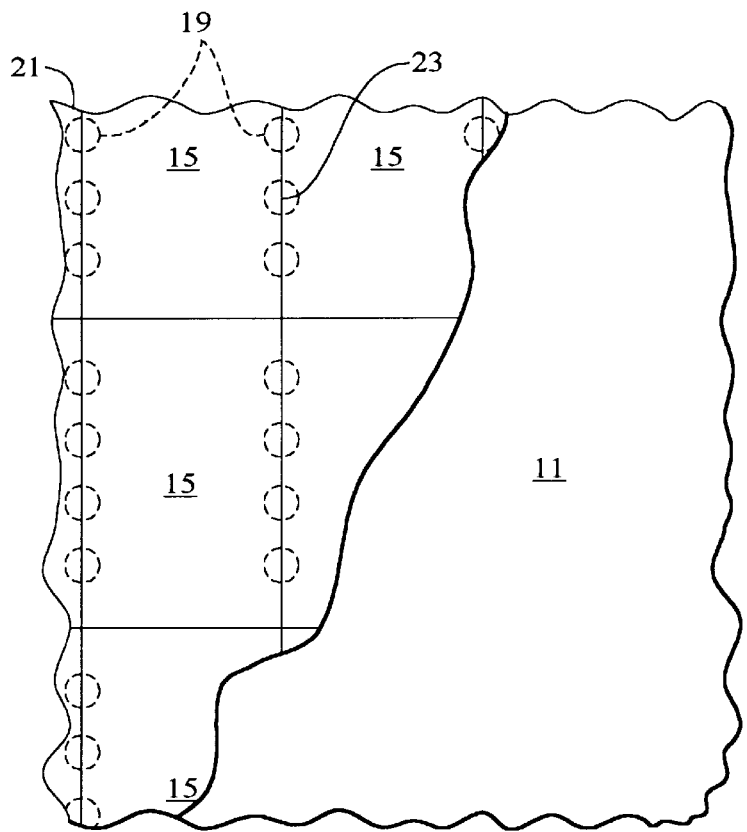
FIG. 3 is another top view of an arrangement of leadless array packages during a manufacturing stage illustrating a second embodiment of the invention.

FIG. 3 serves to illustrate the case when the size of the IC chip 15 is the same as the size of the base layer area (defined in FIG. 2 as the area having the length 14 and width 12 of the standard SOIC package). In this case, the distance between the metal chip pads 19 and the board contacts 23 is minimal and, instead of wire bonding, flip chip/bump technology is used to attach the IC chip 15 to the base layer area 16.

Referring back again to FIG. 2, after wire bonding and die attachment, an encapsulant material 11, preferably an epoxy overcoat or plastic molding, is applied over the entire array of integrated circuit chips 15 and the base layer 21. Generally, this encapsulant material should be no more than 2 mm in thickness. Then, the entire base layer 21, having IC chips attached and covered by the encapsulant material 11, is partially divided into individual array packages. The partial singulation electrically isolates each individual chip package from the other chip packages so that they may be individually tested. As discussed above, the size of the individual chip array package is the same as that of the standard dimensions of a SOIC chip package. In this way, the array package will fit in the standard size SOIC footprint.

After the partial division into individual chip packages described above, the chip packages are tested. Typically, these tests will consist of the standard industry production tests that are intended to determine whether there are any localized fabrication faults that will cause failure of the integrated circuit. These tests can be carried out by conventional testing equipment, such as probe cards or wafer probers and the like. Most conventional testing devices have probes that are small enough to contact the board contacts 23 (that are connected to the bonding pads). The potential also exists for testing several of the chip packages in parallel. After the chips are tested and are found to have been in compliance with the test requirements, the base layer is completely divided into individual chip packages. This final singulation after testing is generally just a laser cut to completely separate the chip packages (all of the electrical connections between the chip packages having already been separated before testing).

Figure 4:
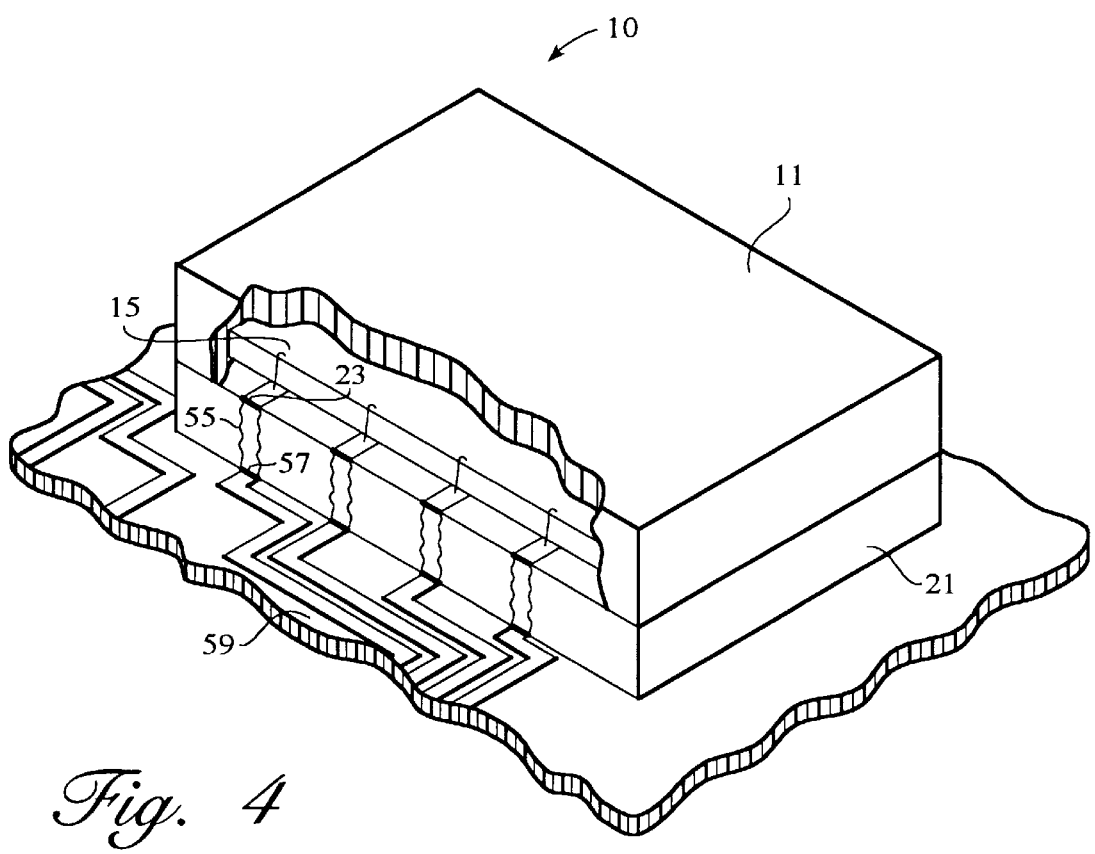
FIG. 4 is a perspective view of a leadless array package illustrating the method of mounting the package on the end user's printed circuit board.

With reference to FIG. 4, the completed IC array package 10, can be installed on the end-user's printed circuit board 59. The IC array package 10 is placed on top of solder pads 57 on the printed circuit board 59. The solder pads 57 correspond to the board contacts 23 which are exposed on the edge of the IC array package 10. Solder paste is applied to the solder pads 57 and then the printed circuit board 59 and IC array package are heated in a convection furnace. The solder paste wicks up and there is solder flow 55 between the solder pads 57 and the board contacts 23. When the solder flow cools, after removal from the furnace, an electrical and mechanical connection exists between the leadless array package 10 and the printed circuit board 59 of the end user.

What is claimed is:

1. A leadless integrated circuit package comprising:
   a base layer made of an insulating substrate and having two opposed sides including a top side having outer edges and having a plurality of bonding pads arranged on a perimeter of the base layer, the base layer being of a size corresponding to a standard leaded integrated circuit footprint;
   an integrated circuit chip having a plurality of interconnection pads on a perimeter thereof, the integrated circuit chip having a silicon die being of the same size or smaller than the size of the base layer, the integrated circuit chip being attached to the top side of the base layer;
   an encapsulant material enclosing the integrated circuit chip and extending to the outer edges of the top side of the base layer; and
   a series of circuit board contacts arranged around the perimeter on at least one of the outer edges of the top side of the base layer and being connected to the bonding pads on the perimeter of the base layer and not being covered by the encapsulant material, the board contacts making solder flow connection to the circuit board.

2. A leadless integrated circuit package, as in claim 1, wherein the base layer is comprised of epoxy-glass.

3. A leadless integrated circuit package, as in claim 1, wherein the integrated circuit chip has a lead count of less than thirty three chip contacts.

4. A leadless integrated circuit package for mounting on a circuit board and connecting to leads thereon comprising:
   a circuit board with leads having solder thereon,
   an integrated circuit chip having a plurality of interconnection pads on a perimeter thereof;
   a base layer having a perimeter without exposed holes and having a length and a width corresponding to a standard size leaded integrated circuit package, and having two opposed major sides including a top side having outer edges and having a plurality of bonding pads arranged on the perimeter of the base layer and corresponding to the interconnection pads on the integrated circuit chip, the integrated circuit chip being bonded to the top side of the base layer;

an encapsulant material covering the integrated circuit chip and extending to the outer edges of the top side of the base layer; and a series of circuit board contacts arranged around the perimeter on at least one of the outer edges of the top side of the base layer and being connected to the bonding pads and not being covered by the encapsulant material, the board contacts making solder flow connection to the circuit board.

5. A leadless integrated circuit package, as in claim 1, wherein the base layer is comprised of epoxy-glass.

6. A leadless integrated circuit package, as in claim 1, wherein the integrated circuit chip has a length and width less than or equal to the length and width of the base layer.

7. A leadless integrated circuit package, as in claim 1, wherein the length and the width of the base layer correspond to the standard length and width of a standard small outline integrated circuit (SOIC) footprint.

8. A leadless array package, as in claim 1, wherein the length and the width of the base layer correspond to the length and width of a standard thin small outline package (TSOP) footprint.

9. A leadless integrated circuit package for mounting to an external circuit board comprising:

an integrated circuit chip having a plurality of interconnection pads on a perimeter thereof;

a base layer being of a size corresponding to a standard small outline integrated circuit footprint and being made of an insulating material and having two opposed sides including a top side having outer edges and having a plurality of bonding pads arranged on a perimeter of the base layer and corresponding to the interconnection pads on the integrated circuit chip, the integrated circuit chip being bonded to the top side of the base layer and being of the same size or smaller than the size of the base layer and having a lead count of less than thirty three chip contacts;

an encapsulant material enclosing the integrated circuit chip and extending to the outer edges of the top side of the base layer, but with the bonding pads exposed; and a series of circuit board contacts disposed on at least one of the outer edges on the top side of the base layer around the perimeter of the base layer and being connected to the bonding pads on the perimeter of the base layer, the base layer contacts making solder flow connection to the external circuit board.

10. A leadless integrated circuit package for mounting on a circuit board and connecting to leads thereon comprising:

an integrated circuit chip mounted on a rectangular base with major upper and lower surfaces, without holes in the periphery of the base, with contact pads about the periphery of the upper surface of the base, the base layer being of a size corresponding to a standard integrated circuit footprint, an encapsulation structure covering the chip and the upper surface of the base except for portions of the bonding pads, with overall dimensions such that the contact pads are at the edges of the encapsulation structure, and a circuit board with a pattern of leads receiving the encapsulation structure, with the circuit board supplying solder to connect the contact pads on the upper surface of the base with the contact pads on the lower surface.

11. The apparatus of claim 10 wherein the overall dimensions of the structure correspond to the dimensions of a standard small outline package footprint.

\* \* \* \* \*

UNITED STATES PATENT AND TRADEMARK OFFICE
CERTIFICATE OF CORRECTION

PATENT NO.    : 6,177,722 B1
DATED         : January 23, 2001
INVENTOR(S)   : Julius A. Kovats et al.

It is certified that error appears in the above-identified patent and that said Letters Patent is hereby corrected as shown below:

Title page,
Item [75], Inventors, "Julius A. Kovats, Manitou Springs, CO (US); Paul I. Suciu, Saratoga, CA (US)" should read -- Julius A. Kovats, Manitou Springs, CO (US); Paul I. Suciu, Saratoga, CA (US); Anthony E. Panczat, Phoenix, AZ (US); Thomas P. Glenn, Gilbert, AZ (US) --.

Column 4,
Lines 31 and 32, "A size corresponding to a standard leaded integrated circuit footprint:" should read -- A size corresponding to a standard size leaded integrated circuit footprint: --.

Signed and Sealed this

Thirteenth Day of August, 2002

Attest:

Attesting Officer

JAMES E. ROGAN
*Director of the United States Patent and Trademark Office*